US006944059B2

(12) United States Patent
Macerola

(10) Patent No.: US 6,944,059 B2
(45) Date of Patent: Sep. 13, 2005

(54) HIGH VOLTAGE GENERATION AND REGULATION CIRCUIT IN A MEMORY DEVICE

(75) Inventor: Agostino Macerola, Via della Chiesa (IT)

(73) Assignee: Micron Technology, Inc., Boise, ID (US)

( * ) Notice: Subject to any disclaimer, the term of this patent is extended or adjusted under 35 U.S.C. 154(b) by 103 days.

(21) Appl. No.: 10/726,265

(22) Filed: Dec. 2, 2003

(65) Prior Publication Data

US 2005/0007832 A1 Jan. 13, 2005

(30) Foreign Application Priority Data

Jul. 11, 2003 (IT) .................................... RM2003A0338

(51) Int. Cl.[7] ................................................ G11C 16/04

(52) U.S. Cl. ............................ 365/185.25; 365/189.09; 365/204

(58) Field of Search ....................... 365/185.25, 189.09, 365/204, 226

(56) References Cited

U.S. PATENT DOCUMENTS

| | | | | |
|---|---|---|---|---|
| 4,389,705 A | | 6/1983 | Sheppard | |
| 5,781,477 A | * | 7/1998 | Rinerson et al. | 365/185.29 |
| 5,999,456 A | * | 12/1999 | Sali et al. | 365/185.28 |
| 6,031,774 A | * | 2/2000 | Chung | 365/204 |
| 6,219,293 B1 | | 4/2001 | Butler et al. | |
| 6,456,534 B2 | * | 9/2002 | Jinbo | 365/185.25 |
| 6,480,436 B2 | | 11/2002 | Confalonieri et al. | |
| 6,545,930 B2 | | 4/2003 | Fischer et al. | |
| 6,697,288 B2 | | 2/2004 | Kim et al. | |
| 6,707,715 B2 | | 3/2004 | Michael et al. | |

* cited by examiner

*Primary Examiner*—VanThu Nguyen
(74) *Attorney, Agent, or Firm*—Leffert Jay & Polglaze, P.A.

(57) ABSTRACT

An auxiliary voltage generation circuit is part of a high voltage generation and regulation circuit. The auxiliary voltage generation circuit generates an auxiliary intermediate voltage that is coupled to a negative level shifting circuit to reduce the drain-source stress experienced by transistors in that circuit that are in an off state. The auxiliary voltage generation circuit also generates a logic control signal that indicates to a high voltage discharge path to perform either a slow discharge operation or a fast discharge operation.

24 Claims, 6 Drawing Sheets

DC block logic table.

| enable | Disch fast | S | F |
|---|---|---|---|
| 0 | 0 | 1 | 0 |
| 0 | 1 | 1 | 1 |
| 1 | 0 | 0 | 0 |
| 1 | 1 | 0 | 0 |

HIGH VOLTAGE GENERATION AND REGULATION CIRCUIT IN A MEMORY DEVICE

RELATED APPLICATIONS

This application claims priority to Italian Patent Application Serial No. RM2003A000338, filed Jul. 11, 2003, entitled "A HIGH VOLTAGE GENERATION AND REGULATION CIRCUIT IN A MEMORY DEVICE," and which is incorporated herein by reference.

TECHNICAL FIELD OF THE INVENTION

The present invention relates generally to memory devices and in particular the present invention relates to voltage management in memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices. Most electronic devices are designed with a single flash memory device.

In order to increase the memory density of flash memories while making them smaller, the silicon is scaled. Associated with minimum length scaling is a reduction of the oxide thickness and the junctions become less graded. This results in a decrease of the maximum voltage that is tolerated between terminals of the transistors. For example, a high drain-to-source voltage ($V_{ds}$) could exceed the breakdown limit of the transistor, eventually causing the transistor to fail.

An additional problem is experienced when the gate-to-source voltage ($V_{gs}$) goes high while $V_{ds}$ has a high value. This condition is referred to in the art as snapback. The high level of current associated with this phenomenon may damage the device and/or decrease its life.

Flash memory devices require a large negative voltage to erase the memory cells. The negative voltage is generated and regulated by an internal high voltage pump connected to control circuitry to control output of the high voltage.

FIG. 1 illustrates a block diagram of a typical prior art circuit for generating a high negative erase voltage. This circuit is connected to the wordlines of the memory array that are modeled here by a capacitor 101. REFN and REFH are analog values that are used to assign the target voltage values to $V_{NEG}$ and $V_{HV}$ rails, respectively. SELECT passes the high voltages to the sector/sectors that are to be erased. ENABLE activates the erase pulse.

The prior art system can have four different phases that are selected by the ENABLE signal and the $V_{NEG}$ and $V_{HV}$ values. These phases are an off state, ramp phase, pulse phase, and discharge phase.

The off state occurs when ENABLE=0, $V_{NEG}$ and $V_{HV}$ are shorted to ground by the discharge paths 103 and 104. The ramp phase is selected when ENABLE=1, $V_{NEG}$ and $V_{HV}$ are below their target values. The negative and HV pumps 107 and 108 are turned on during this phase. The pulse phase is selected when ENABLE=1, $V_{NEG}$ and $V_{HV}$ are at their target voltages. The negative and HV pumps 107 and 108 are turned off during this phase. The discharge phase is selected when ENABLE=0, $V_{NEG}$ and $V_{HV}$ are discharged to ground; each through its own path 104 and 103 respectively.

The circuit illustrated in FIG. 1 may cause snapback problems that increase the stress some transistors experience during their off state. This decreases the reliability of the transistors in the memory device. For the reasons stated above, and for other reasons stated below which will become apparent to those skilled in the art upon reading and understanding the present specification, there is a need in the art for a high voltage management circuit to improve the reliability of memory device transistors.

SUMMARY

The above-mentioned problems with high, erase voltage management in a memory device and other problems are addressed by the present invention and will be understood by reading and studying the following specification.

A high voltage generation and regulation circuit has a plurality of operational phases. The circuit can be used in a memory device erase operation to increase the reliability of the erase circuit components.

The circuit is has a positive high voltage pump that generates a positive high voltage signal for use in the memory device erase operation. A negative high voltage pump generates a negative high voltage signal for use in the erase operation. An auxiliary voltage generator generates a control signal for controlling a rate of discharge of the positive high voltage signal. The auxiliary voltage generator also generates an auxiliary voltage that is used by a negative level shifter to prevent drain-source stress of transistors comprising the level shifter.

Further embodiments of the invention include methods and apparatus of varying scope.

DETAILED DESCRIPTION

Figure 1:
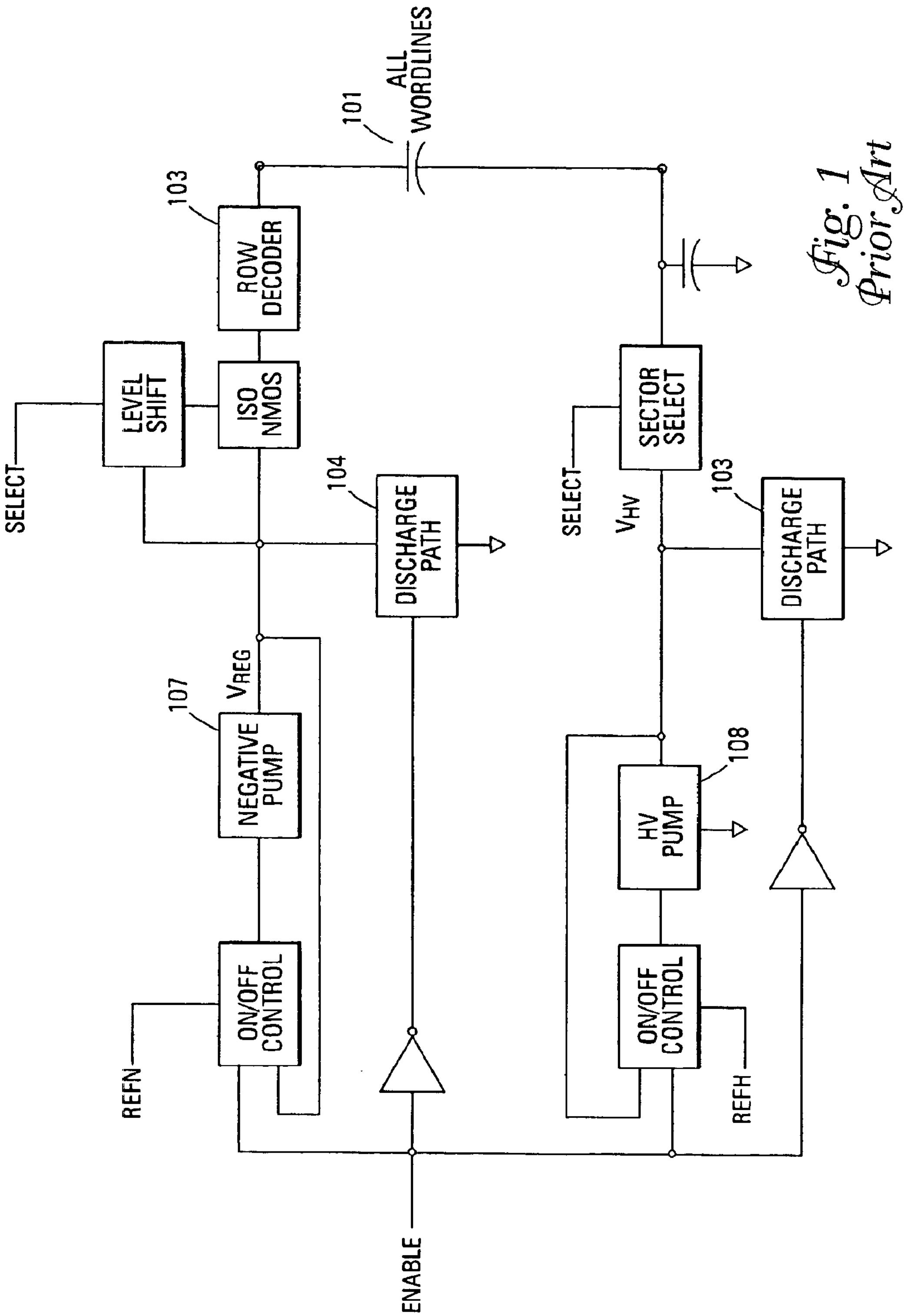
FIG. 1 shows a block diagram of a typical prior art high voltage generation and regulation circuit.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
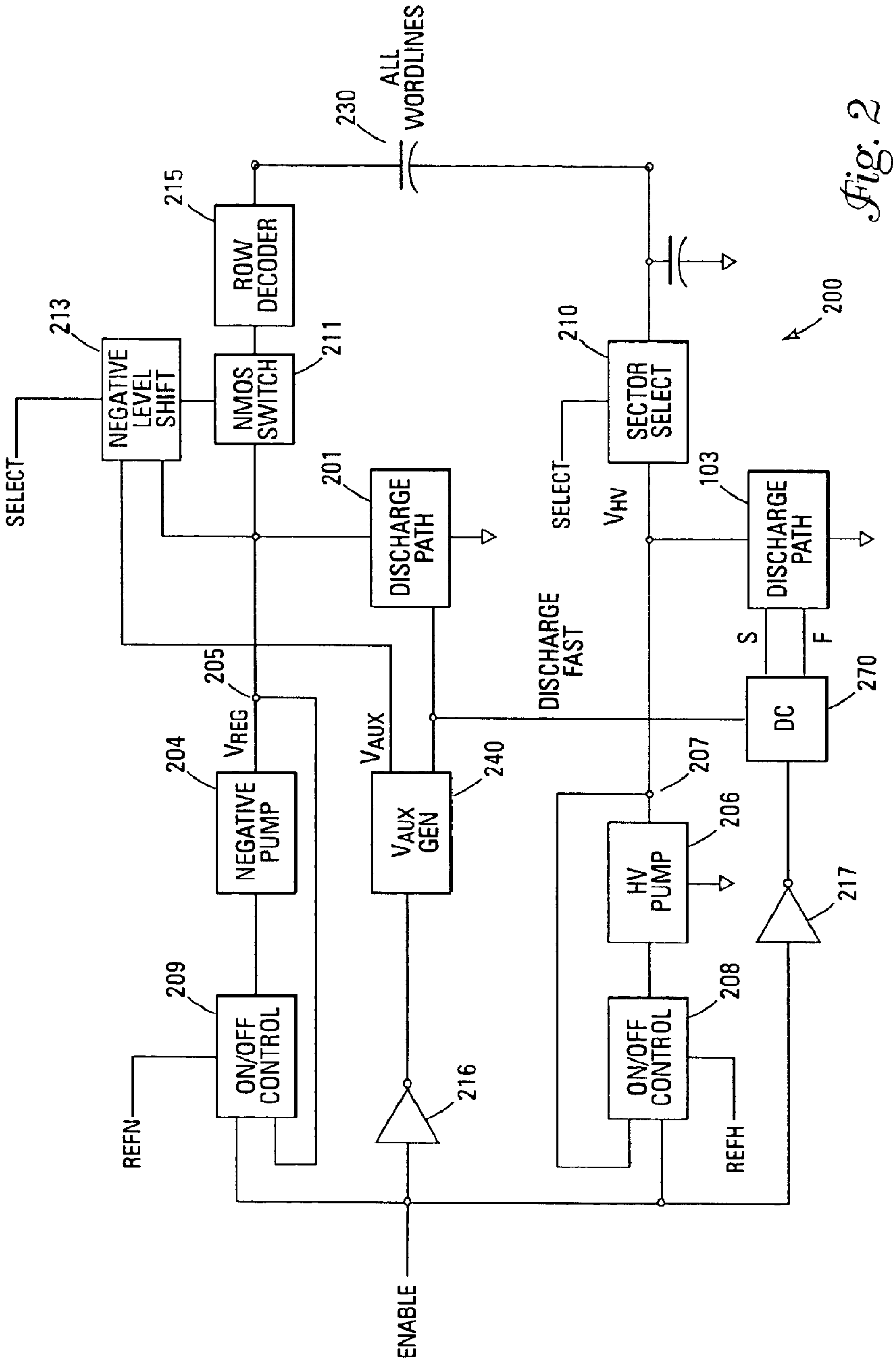
FIG. 2 shows a block diagram of one embodiment of a high voltage generation and regulation circuit of the present invention.

FIG. 2 illustrates a block diagram of one embodiment for a high voltage generation and regulation circuit 200 of the present invention. This circuit 200 includes an auxiliary voltage ($V_{AUX}$) generator 240 to generate an auxiliary intermediate negative voltage that is used to better manage the voltages of the circuit and thus avoid damage to transistors in the high voltage generation and regulation circuit 200. The auxiliary voltage generator 240 also generates a discharge rate control signal that selects a discharge rate for at least one of the discharge paths.

The $V_{AUX}$ generator 240 has a single input, ENABLE*, and two outputs: $V_{AUX}$ and logic signal DISCHARGE FAST. The ENABLE* signal is provided by inverting 216 the ENABLE signal. By using the $V_{AUX}$ generator 240, the circuit can perform five phases for better voltage management: an off state, a ramp phase, a pulse state, a slow discharge phase, and a fast discharge phase. A more detailed description of the $V_{AUX}$ generator 240 is provided subsequently with reference to FIG. 3.

A negative voltage pump 204 is a negative voltage multiplier. When the negative voltage pump 204 is turned on, it sinks a charge from the $V_{NEG}$ node 205 thus forcing a lower voltage on that node 205 than ground potential. The negative voltage pump 204 cannot cause a rising $V_{NEG}$ so this voltage remains after the pump 204 is turned off.

A high voltage (HV) pump 206 is a positive voltage multiplier. When this pump 206 is turned on, it produces a charge on the $V_{HV}$ node 207 that is higher than the supply voltage ($V_{CC}$). The HV pump 206 cannot discharge $V_{HV}$ when it is turned off so the voltage at this node 207 is maintained after the HV pump 206 is off.

In one embodiment, the negative voltage pump 204 generates −9V while the HV pump 206 generates a +9V. The −9V is applied, through the row decoder 215, to the gate of the memory cells. The +9V is applied, through the sector selector, to the substrate of the memory cells. The two voltages together on the wordlines 230 then create the −18V required for erasing flash memory. Alternate embodiments use other voltages as required by the memory embodiment.

The block diagram of FIG. 2 has been simplified for purposes of clarity. All of the memory array wordlines 230 have been combined into one capacitance 230 that models the combined connections.

On/Off control blocks 208 and 209 turn on their respective voltage pumps 206 and 204 when ENABLE is asserted and the absolute value of the output voltages $V_{HV}$ and $V_{NEG}$ are lower than the input voltages REFH and REFN respectively. As is well known in the art, REFH and REFN are the target erase voltages.

Discharge paths 201 and 203 provide a discharge path to ground for their respective charge pumps 204 and 206. These paths 201 and 203 are enabled when ENABLE is asserted. During the time that the discharge paths 201 and 203 are disabled, their respective high voltage nodes 201 and 207 remain at $V_{NEG}$ and $V_{HV}$.

Figures 5, 7:
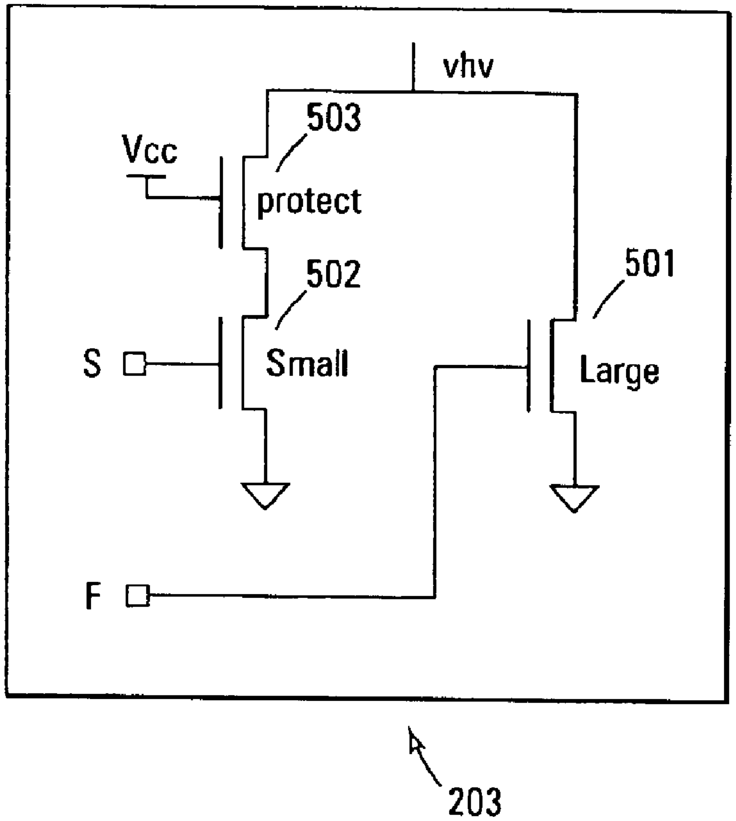
FIG. 5 shows a simplified schematic diagram of a discharge path in accordance with one embodiment of the present invention.
FIG. 7 shows one embodiment of a discharge control block logic table of the present invention.

A discharge control (DC) block 270 enables either a slow or a fast discharge path for the $V_{HV}$ voltage. The choice of discharge paths is performed by the DISCHARGE FAST signal, from the VAUX generator, when ENABLE is at a logical low level. When DISCHARGE FAST is a logical high (and ENABLE=0), the fast HV discharge path is chosen. When DISCHARGE FAST is a logical low (and ENABLE=0), the slow HV discharge path is chosen and $V_{NEG}$ is discharged by $V_{AUX}$. When ENABLE is a logical high, the DC block 270 is disabled. FIG. 7 illustrates a DC block logic table that summarizes the outputs that result from the various states of the ENABLE and DISCHARGE FAST signals. Alternate embodiments use other logic levels to choose between the discharge paths.

A negative level shifter 213 translates a logic signal (SELECT) that swings between 0 and $V_{CC}$ to a high voltage signal that swings between $V_{NEG}$ and $V_{CC}$. When SELECT is a logic 0, the level shifter 213 outputs the negative voltage $V_{NEG}$. When SELECT is a logic 1, the level shifter outputs $V_{CC}$. $V_{AUX}$ is input to the level shifter to prevent drain-source stress in the internal circuitry of the negative level shifter 213.

The NMOS switch block 211 is an insulated NMOS switch that delivers the negative voltage $V_{NEG}$ to the row decoder 215 if the NMOS gate is driven at ground potential. When SELECT is a logic 0 and the level shifter 213 outputs $V_{NEG}$, the NMOS switch is turned off.

The row decoder 215 is the driver for the wordlines of the sector. The row decoder 215 illustrated in FIG. 2 is simplified to show that when $V_{NEG}$ reaches the row decoder 215, all of the wordlines are tied to $V_{NEG}$.

The sector selector 210 selects the memory sector that is to be erased. The SELECT signal determines the sector to which the $V_{HV}$ signal is applied.

The SELECT signal that is input to both the negative level shifter 213 and the sector selector 210 is generated from the memory addresses input to the memory device of which the negative voltage control circuit is a part. When a block of memory is to be erased, using the high negative voltages generated by the negative voltage control circuit, the address of the memory block is asserted during the erase user command and latched during the entire erase operation. The SELECT signal is then generated from this latched address.

The five operational phases of the high voltage generation and regulation circuit of the present invention are provided by the ENABLE signal and the $V_{NEG}$ and $V_{HV}$ signals. The off state is enabled when ENABLE=0 and $V_{NEG}$ and $V_{HV}$ are shorted to ground by their respective discharge paths 201 and 203.

The ramp phase is enabled when ENABLE=1 and $V_{NEG}$ and $V_{HV}$ are below their target values of −9V and +9V respectively. The negative and HV pumps 204 and 206 are turned on and $V_{AUX}$ is charged to a negative voltage by $V_{NEG}$. The ramp phase is responsible for generating the required target voltages to perform the erase operation.

The pulse state is enabled when ENABLE=1 and $V_{NEG}$ and $V_{HV}$ are at their target values of −9V and +9V respectively. In this case, their respective pumps 204 and 206 are turned off. $V_{AUX}$ has reached its target value of $V_{NEG}+n*V_t$ where n is the number of insulated NMOS transistors in the chain and $V_t$ is the threshold voltage of each single transistor. During this phase, the erase pulses to the flash memory cells are generated.

The slow discharge phase is enabled when ENABLE=0 and DISCHARGE FAST=0. In this phase, $V_{NEG}$ is discharged by $V_{AUX}$ and the HV rail is slowly discharged through its discharge path 203.

The fast discharge phase is enabled when ENABLE=0 and $V_{NEG}$ and $V_{HV}$ are each discharged to ground through their respective discharge paths 201 and 203.

Figure 3:
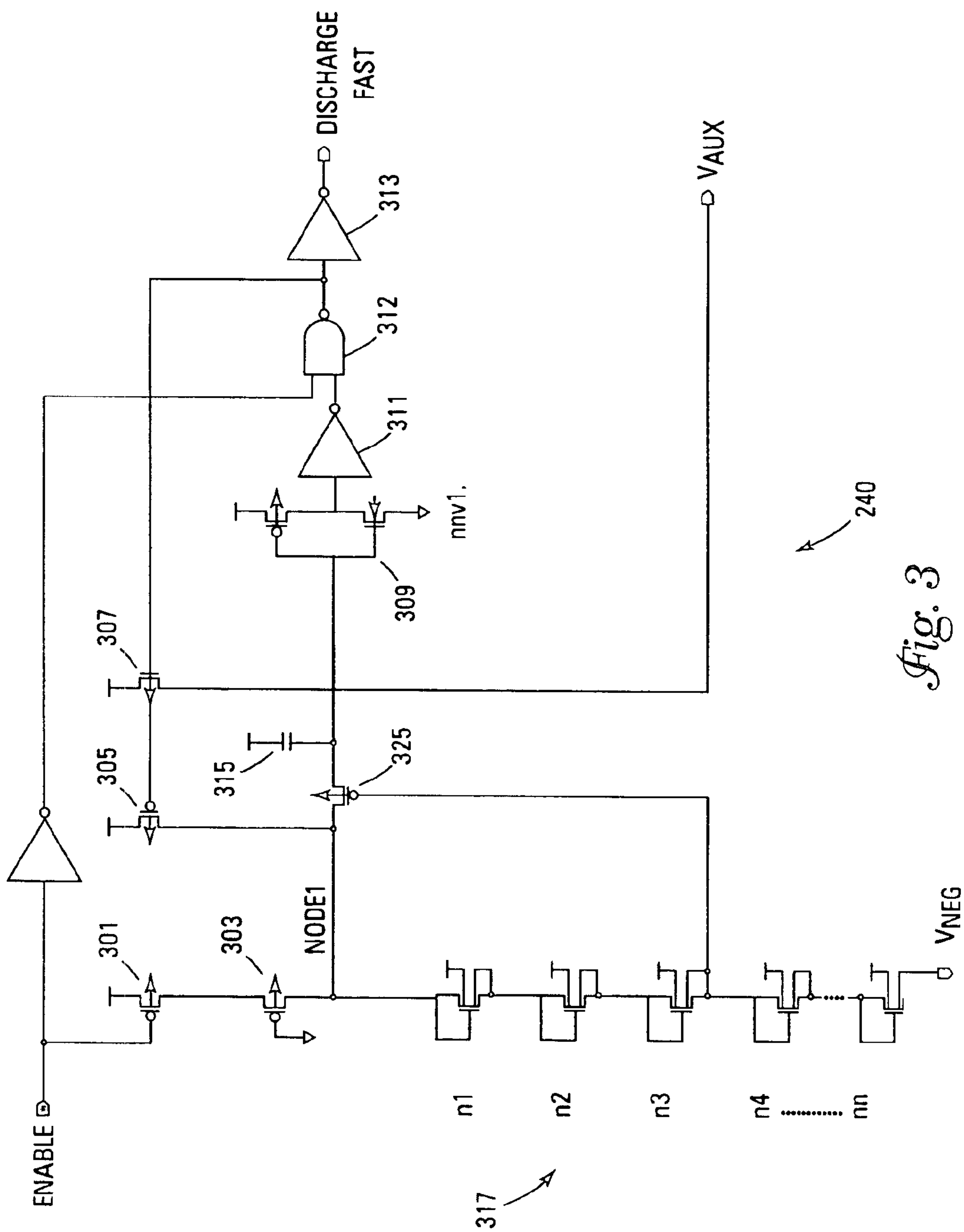
FIG. 3 shows a schematic diagram of one embodiment of an auxiliary voltage generation circuit in accordance with the embodiment of FIG. 2.

FIG. 3 illustrates a schematic diagram of one embodiment of the $V_{AUX}$ circuit of FIG. 2. This circuit includes an insulated NMOS transistor chain 317 that are connected like diodes. These transistors are referred to as $n_1, n_2, \ldots n_n$. The final transistor in the chain 317, $n_n$, is coupled to $V_{NEG}$ as illustrated in FIG. 2.

The circuit further includes three enabling p-type transistors 301, 305, and 307. The transistor coupled to ENABLE is a low voltage transistor while the remaining two transistors 305 and 307 are high voltage transistors.

Two insulating p-type high voltage transistors 303 and 325 are coupled together at NODE1. One of the high voltage transistors 325 is coupled to the DISCHARGE FAST output through output control logic. This logic, in one embodiment, is comprised of an inverter 309 implemented using high voltage transistors, an inverter 311, a NAND gate 312 having a second input coupled to ENABLE*, and another inverter 313. A filter capacitor 315 couples the high voltage transistor to $V_{CC}$.

The above-described circuit elements of the $V_{AUX}$ circuit of the present invention are utilized differently for the various phases of the present invention. The operation of the $V_{AUX}$ circuit for each phase is described subsequently.

During the Off State, ENABLE is at a logic low level and the low voltage p-type transistor 301 is turned on. This turns on the two insulating p-type transistors 303 and 325. The signal DISCHARGE FAST is a logic high and $V_{NEG}$=0V. $V_{AUX}$ is shorted to $V_{CC}$ by transistor 307.

During the ramp phase, ENABLE is at a logic high level. The signal DISCHARGE FAST goes to a logic low level and, consequently, the two high voltage enabling transistors 305 and 307 are turned off. Since transistor 301 is off, the nodes NODE1 and $V_{AUX}$ are floating. The filter capacitor 315 keeps NODE1 and $V_{AUX}$ at $V_{CC}$. $V_{NEG}$, the output of the negative pump, starts going negative during this phase.

When $V_{NEG}$ reaches a negative value equal to $n^*V_t$, the insulated NMOS transistor chain 317 starts to allow the current to flow. From this point, NODE1 follows $V_{NEG}$ with a voltage equal to $V_{NEG}+n^*V_t$. Note that transistor 325 is on so that $V_{AUX}$ follows NODE1 with a little delay due to the RC circuit represented by the on-resistance of the transistor 325 and capacitor 315.

During the pulse phase, when $V_{NEG}$ reaches its target value, the negative pump stops. For example, if the target value of $V_{NEG}$ were −9V, n=5, and $V_t$=0.8V, the target value for $V_{AUX}$ is −9+5*(0.8)=−5V.

During the slow discharge phase, ENABLE returns to a logic low level to enable transistor 301. Since $V_{AUX}<V_{t\_inv1}$ (the commutation threshold of the high voltage inverter 309), the signal DISCHARGE FAST remains at a logic low level. The source of transistor 301 goes to $V_{CC}$ turning on transistor 303. The voltage at NODE1 then starts to rise. Through NODE1, the $V_{NEG}$ and $V_{AUX}$ nodes are slowly discharged. The RC circuit formed by the filter capacitor 315 and transistor 325 delays the rise of $V_{AUX}$ with respect to NODE1.

When the insulated NMOS transistor chain 317 discharges the high capacitive node $V_{NEG}$, their $V_{gs}$ is several hundreds of millivolts greater than the threshold voltage $V_t$. By choosing the length of the insulated NMOS transistor chain 317, the resistance of transistor 325, and the capacitance of capacitor 315, it is possible to regulate the value of $V_{NEG}$ such that it corresponds to the commutation of INV1.

Note that the capacitor 315 is in part due to the load represented by the negative level shifters and in part to an added capacitance. The $V_{NEG}$ capacitance is very large with respect to the filter capacitor 315. This explains why, when $V_{NEG}$ is ramping down, the current required to ramp down $V_{AUX}$ is limited. Otherwise, when VNEG is discharged, the current required is higher and the $V_{gs}$ of the transistors in the chain 317 increases.

During the fast discharge phase, the commutation of INV1 forces the DISCHARGE FAST signal to a logic high level and the discharge becomes fast through the normal paths. $V_{NEG}$ is now low enough to avoid snapback in the discharging transistor. In this phase, the PMOS transistors 305 and 307 are on and $V_{AUX}$ returns to $V_{CC}$ in order to guarantee the required voltage separation with respect to $V_{NEG}$, as discussed previously.

Figure 4:
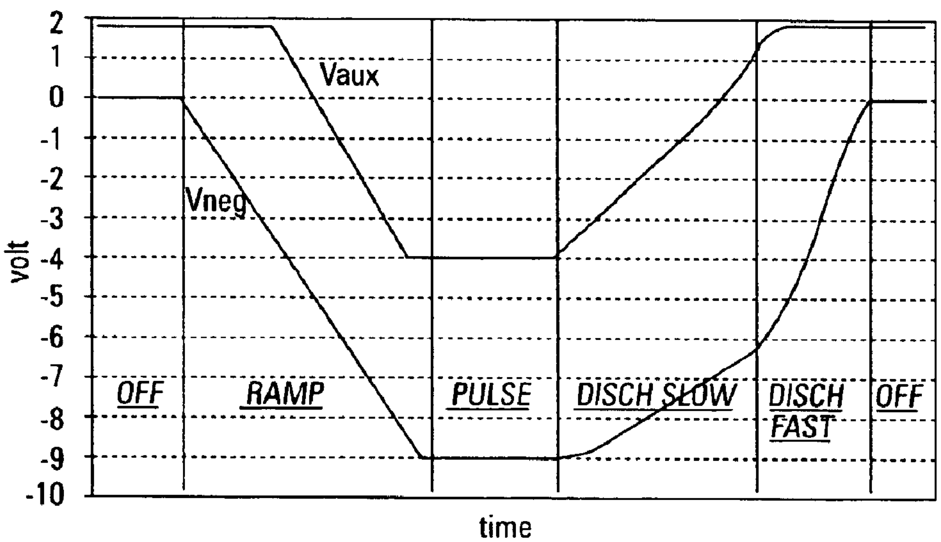
FIG. 4 shows a waveform of $V_{AUX}$ in relation to $V_{NEG}$ in accordance with one embodiment of the present invention.

FIG. 4 illustrates a graphical plot of $V_{AUX}$ in accordance with the embodiments of FIGS. 2 and 3. This graph shows $V_{AUX}$ in relation to $V_{NEG}$ for the five operational phases of the present invention. Time is along the x-axis of the plot and voltage levels are on the y-axis.

This plot shows that during the slow discharge phase, the $V_{NEG}$ signal discharges at a slower rate than $V_{AUX}$. $V_{NEG}$ discharges at a substantially faster rate during the fast discharge phase.

In one embodiment, $V_{AUX} \geqq V_{NEG}+V_{CC}$ during all phases and $-5V<V_{AUX}<-3V$ during the pulse phase. In the high voltage generation and regulation circuit of the present invention, when ENABLE is low, $V_{AUX}$ is tied to $V_{CC}$ as described previously. When ENABLE goes high, $V_{AUX}$ is discharged by $V_{NEG}$ (driven by the negative pump of FIG. 2) by the chain of insulated NMOS transistors of FIG. 3. The target value of $V_{NEG}$, as illustrated in this waveform, is equal to $V_{NEG}+n^*V_t$.

FIG. 5 illustrates a simplified schematic diagram of one embodiment of the HV discharge path 203 of the present invention. This discharge path 203 is coupled to the DC block 270 of FIG. 2 and determines the discharge rate of VHV in response to the enable signal and the DISCHARGE FAST signal.

The discharge path 203 is comprised of two transistors 501 and 502. The “LARGE” and “SMALL” labels refer to the widths of the transistors 501 and 502 and, therefore, the ability to discharge the $V_{HV}$ signal in a fast or slow manner.

The input of the discharge path circuit is the $V_{HV}$ signal from the positive high voltage pump. This signal goes through the transistor 501 and 502 path(s) to ground, depending on the rate of discharge chosen by the ENABLE and DISCHARGE FAST signals. Referring also to FIG. 7, if ENABLE is low and DISCHARGE FAST is low, S is high and the smaller transistor 502 is turned on so that $V_{HV}$ is shorted to ground through that transistor 502. If ENABLE is low and DISCHARGE FAST is high, F and S are both high, turning on both of the transistors 501 and 502. The $V_{HV}$ signal is then shorted to ground through both transistors 501 and 502, greatly increasing the rate of discharge. When ENABLE is high, the DC block is disabled.

Figure 6:
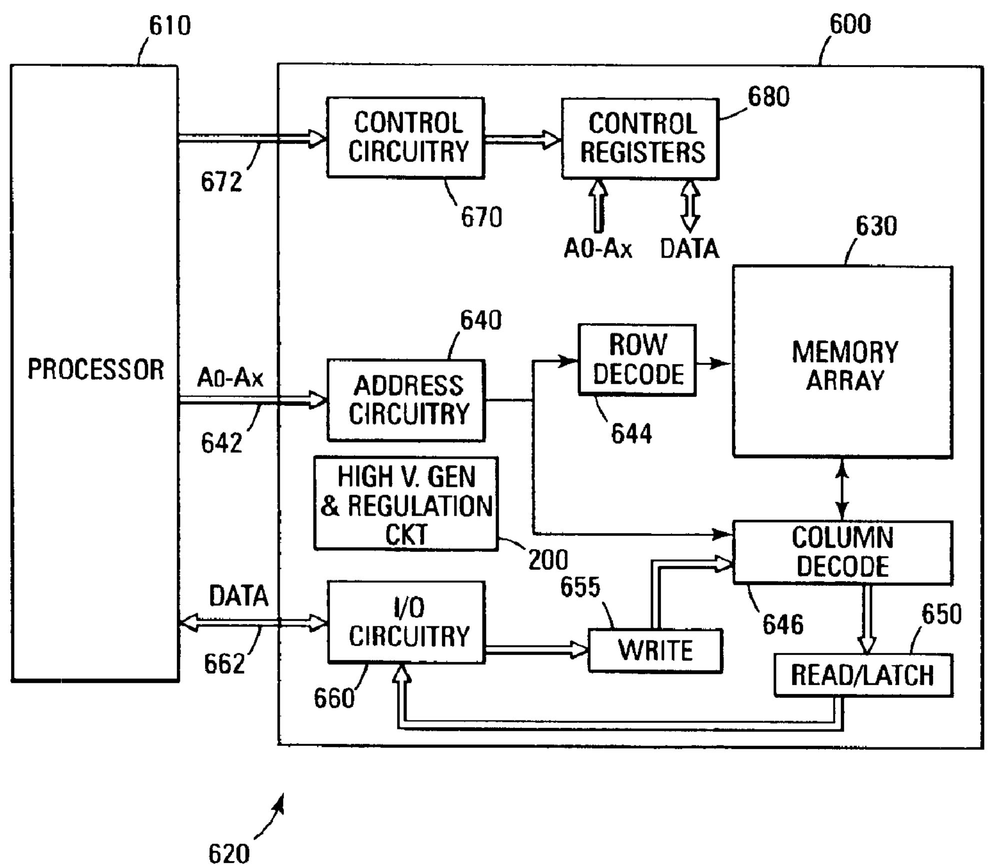
FIG. 6 shows a block diagram of one embodiment of a memory system incorporating a flash memory device of the present invention.

FIG. 6 illustrates a functional block diagram of a memory device 600 of one embodiment of the present invention that is coupled to a controller circuit 610. The controller circuit 610 may be a microprocessor, a processor, or some other type of controlling circuitry. The memory device 600 and the controller 610 form part of an electronic system 620. The memory device 600 has been simplified to focus on features of the memory that are helpful in understanding the present invention.

The memory device includes an array of memory cells 630. The memory cells are non-volatile floating-gate memory cells and the memory array 630 is arranged in banks of rows and columns.

An address buffer circuit 640 is provided to latch address signals provided on address input connections A0–Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/latch circuitry 650. The sense/latch circuitry, in one embodiment, is coupled to read and latch a row of data from the memory array 630. Data input and output buffer circuitry 660 is included for bi-directional data communication over a plurality of data connections 662 with the controller 610). Write circuitry 655 is provided to write data to the memory array.

Control circuitry 670 decodes signals provided on control connections 672 from the processor 610. These signals are used to control the operations on the memory array 630, including data read, data write, and erase operations. In one embodiment, the control circuitry 670 executes the methods of the present invention.

Chip select generation circuitry 625 generates the chip select signals for the memory device 600. This circuitry 625 uses the address connections 642 from the controller 610 to generate the appropriate chip select signal depending on the address present on the address connections 642.

The high voltage generation and regulation circuit 200 of the present invention is embedded in the flash memory device. For purposes of clarity, the interconnections of the different blocks of FIG. 6 are not illustrated but are described in detail with reference to FIGS. 2 and 3 above.

The flash memory device illustrated in FIG. 6 has been simplified to facilitate a basic understanding of the features of the memory. A more detailed understanding of internal circuitry and functions of flash memories are known to those skilled in the art.

CONCLUSION

In summary, the high voltage generation and regulation circuit of the present invention increases the reliability of the negative voltage control circuits and negative level shifters in a memory device. The circuit generates an auxiliary, intermediate voltage to perform a slow discharge phase using insulated NMOS transistors that provide a degree of voltage scaling. The slow discharge phase generates a logic signal (DISCHARGE FAST) that is used by other high voltage components to avoid overshooting on high voltage rails, thus reducing the stress of transistors during their off state.

The embodiments of the present invention are not limited to any one type of memory technology. For example, the circuits and methods of the present invention may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A high voltage generation and regulation circuit, having a plurality of operational phases, for use in a memory device erase operation, the circuit comprising:

a positive high voltage pump that generates a positive high voltage signal for use in the memory device erase operation;

a negative high voltage pump that generates a negative high voltage signal for use in the memory device erase operation; and an auxiliary voltage generator that generates an auxiliary voltage and a control signal for controlling a rate of discharge of the positive high voltage signal.

2. The high voltage generation and regulation circuit of claim 1 and further including:

a first discharge path coupled to the positive high voltage pump and the auxiliary voltage generator, the control signal controlling the rate of discharge of the positive high voltage signal through the first discharge path; and a second discharge path coupled to the negative high voltage pump and the auxiliary voltage generator, the second discharge path discharging the negative high voltage signal in response to the auxiliary voltage.

3. The high voltage generation and regulation circuit of claim 1 wherein the plurality of operational phases comprise an off state, a ramp phase, a pulse state, a slow discharge phase and a fast discharge phase.

4. The high voltage generation and regulation circuit of claim 3 wherein the negative high voltage signal drives the auxiliary voltage during the ramp and pulse phases and the auxiliary voltage discharges the negative high voltage signal during at least one discharge phase.

5. The high voltage generation and regulation circuit of claim 1 and further including an enable signal, coupled to the auxiliary voltage generator, that at least in part enables/disables the auxiliary voltage generator.

6. The high voltage generation and regulation circuit of claim 1 and further including a negative level shifter coupled to the negative high voltage pump that translates an input select signal having a voltage range of 0V to $V_{CC}$ to a high voltage signal having a voltage in the range of the negative high voltage signal as a minimum to $V_{CC}$ as a maximum.

7. The high voltage generation and regulation circuit of claim 6 wherein the auxiliary voltage is input to the negative level shifter to reduce transistor drain-source stress in the level shifter.

8. A high voltage generation and regulation circuit, having a plurality of operational phases, for use in a memory device erase operation, the circuit comprising:

a positive high voltage pump that generates a positive high voltage signal for use in the memory device erase operation;

a negative high voltage pump that generates a negative high voltage signal for use in the memory device erase operation;

a first discharge path coupled to the positive high voltage pump;

a second discharge path coupled to the negative high voltage pump; and an auxiliary voltage generator that generates, in response to an enable signal, an auxiliary voltage and a fast discharge control signal for controlling a rate of discharge of the positive high voltage signal through the first discharge path.

9. The high voltage generation and regulation circuit of claim 8 and further including a DC control block, coupled between the auxiliary voltage generator and the first discharge path, for selecting the rate of discharge in response to the enable signal and the fast discharge control signal.

10. The high voltage generation and regulation circuit of claim 8 and further comprising:

a switch, coupled to the negative high voltage pump, for controlling the output of the negative high voltage signal in response to an address generated select signal; and a memory sector select switch, coupled to the positive high voltage pump, for controlling to which memory sector of the memory device the positive high voltage signal is coupled in response to the select signal.

11. The high voltage generation and regulation circuit of claim 8 and further comprising:

a first on/off control block coupled to the positive high voltage pump for increasing the voltage level of the positive high voltage signal in response to a difference between a reference positive high voltage signal and the positive high voltage signal; and a second on/off control block coupled to the negative high voltage pump for increasing the voltage level of the negative high voltage signal in response to a difference between a reference negative high voltage signal and the negative high voltage signal.

12. A high voltage generation and regulation circuit, having a plurality of operational phases, for use in a memory device erase operation, the circuit comprising:

a positive high voltage pump that generates a positive high voltage signal for use in the memory device erase operation;

a negative high voltage pump that generates a negative high voltage signal for use in the memory device erase operation;

a first discharge path coupled to the positive high voltage pump;

a second discharge path coupled to the negative high voltage pump;

an auxiliary voltage generator that generates, in response to an enable signal, an auxiliary voltage and a fast discharge control signal; and a discharge rate control circuit, coupled between the auxiliary voltage generator and the first discharge path, for selecting, in response to the enable signal and the fast discharge control signal, a fast discharge rate or a slow discharge rate of the positive high voltage signal through the first discharge path.

13. The high voltage generation and regulation circuit of claim 12 and further including:

a negative level shifter coupled to a memory address generated select signal, the negative high voltage signal, and the auxiliary voltage for reducing transistor drain-source stress, the negative level shifter outputting the negative high voltage signal in response to the select signal; and an insulated NMOS switch, coupled to the negative high voltage pump and the negative level shifter, for disabling output of the negative high voltage signal to the memory device in response to the negative high voltage signal from the negative level shifter.

14. The high voltage generation and regulation circuit of claim 13 and further including a sector selector, coupled to the positive high voltage signal, for controlling output of the positive high voltage signal to memory cells of the memory device in response to the select signal.

15. An electronic system comprising:

a processor that generates memory control signals; and a memory device, coupled to the processor, for storing and erasing data in response to the memory control signals, the memory device comprising memory cells for storing the data and a high voltage generation and regulation circuit, having a plurality of operational phases, for use in an erase operation, the circuit comprising:

a positive high voltage pump that generates a positive high voltage signal for use in the erase operation;

a negative high voltage pump that generates a negative high voltage signal for use in the erase operation; and an auxiliary voltage generator that generates an auxiliary voltage and a control signal for controlling a rate of discharge of the positive high voltage signal.

16. The electronic system of claim 15 wherein the memory device is a NAND flash memory.

17. The electronic system of claim 15 wherein the memory device is a NOR flash memory.

18. A voltage generator for generating an auxiliary voltage for use in a high voltage generation and regulation circuit having a negative high voltage pump that generates a negative high voltage, a positive high voltage pump that generates a positive high voltage, an enable signal that enables the generation of the negative and positive high voltages, and a plurality of discharge paths, each coupled to a different voltage pump, the discharge paths experiencing either a fast or a slow discharge phase, the voltage generator comprising:

output control logic that controls output of a discharge rate control signal;

a plurality of NMOS transistors coupled together serially in a diode-like fashion, one end of the plurality of NMOS transistors coupled to and discharging the negative high voltage when the plurality of NMOS transistors are turned on;

a low voltage enabling transistor, coupled to the enable signal, for enabling the voltage generator in response to the enable signal;

a first high voltage insulating transistor, coupled between the low voltage enabling transistor and the plurality of NMOS transistors, a node formed at the junction of the first high voltage insulating transistor and a remaining end of the plurality of NMOS transistors having a voltage that rises in response to the low voltage enabling transistor being turned on;

a first high voltage enabling transistor coupled between $V_{CC}$ and the node, a control gate of the first high voltage enabling transistor coupled to an output of the output control logic, the first high voltage enabling transistor being turned on in response to the discharge rate control signal;

a second high voltage insulating transistor coupled between the node and the output control logic, a control gate of the second high voltage insulating transistor coupled between two of the plurality of NMOS transistors; and a second high voltage enabling transistor coupled between $V_{CC}$ and the auxiliary voltage output, a control gate of the second high voltage enabling transistor coupled to the output of the output control logic, the second high voltage enabling transistor being turned on in response to the discharge rate control signal and generating the auxiliary voltage.

19. The voltage generator of claim 18 wherein the output control logic comprises:

a high voltage inverter having an input coupled to the first high voltage insulating transistor;

a first low voltage inverter coupled to an output of the high voltage inverter;

a NAND gate having a first input coupled to the low voltage inverter and a second input coupled to the enable signal; and a second inverter coupled to an output of the NAND gate.

20. A method for generating erase voltages for a memory device, the method comprising:

generating a positive high voltage signal in response to an enable signal;

generating a negative high voltage signal in response to the enable signal;

generating an auxiliary voltage signal and a fast discharge control signal in response to the enable signal;

discharging the positive high voltage signal at a slow discharge rate in response to a state of the fast discharge control signal; and discharging the positive high voltage signal at a fast discharge rate in response to the state of the fast discharge control signal.

21. The method of claim 19 and further including applying the auxiliary voltage signal to a negative level shifting circuit to reduce drain-source stress on transistors that are off.

22. The method of claim 20 and further including applying the positive high voltage signal and the negative high voltage signal to a plurality of memory cells of the memory device.

23. A memory device comprising:

memory cells for storing the data; and a high voltage generation and regulation circuit, having a plurality of operational phases, for use in an erase operation of the memory cells, the circuit comprising:

a positive high voltage pump that generates a positive high voltage signal for use in the erase operation;

a negative high voltage pump that generates a negative high voltage signal for use in the erase operation; and an auxiliary voltage generator that generates an auxiliary voltage and a control signal for controlling a rate of discharge of the positive high voltage signal.

24. The memory device of claim 23 wherein the high voltage generation and regulation circuit further comprises a negative level shifting circuit, coupled to the auxiliary voltage, such that the auxiliary voltage reduces drain-source stress of transistors in the negative level shifting circuit that are in an off state.

* * * * *